US006369637B1

United States Patent
Kiriaki

(10) Patent No.: US 6,369,637 B1
(45) Date of Patent: Apr. 9, 2002

(54) ANALOG BICMOS MULTIPLEXERS WITH CMOS CONTROL SIGNALS

(75) Inventor: Sami Kiriaki, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/658,777

(22) Filed: Sep. 11, 2000

Related U.S. Application Data

(60) Provisional application No. 60/165,345, filed on Nov. 12, 1999.

(51) Int. Cl.[7] .................. H03K 17/62; H01L 29/772
(52) U.S. Cl. .................. 327/411; 327/99; 327/407; 257/276
(58) Field of Search .................. 327/99, 407, 403, 327/408, 411, 410; 257/276

(56) References Cited

U.S. PATENT DOCUMENTS 6,081,006 A * 6/2000 Nelson .................. 257/276

* cited by examiner

*Primary Examiner*—Dinh T. Le
(74) *Attorney, Agent, or Firm*—Bret J. Petersen; Frederick J. Telecky, Jr.

(57) ABSTRACT

High-bandwidth, analog multiplexer circuits with low signal feed-through and good common mode properties are described. These are BiCMOS circuits with N-MOS control transistors which emphasize low parasitic capacitance through circuit layout techniques and the use of smaller geometry devices where possible. These circuits can be used in both single-ended and differential configurations and address applications having multiplexing ratio requirements ranging from 2-to-1 up to many-to-1.

15 Claims, 3 Drawing Sheets

ANALOG BICMOS MULTIPLEXERS WITH CMOS CONTROL SIGNALS

This application claims priority under 35 USC §119(e)(1) of provisional application No. 60/165,345 filed Nov. 12, 1999.

BACKGROUND OF THE INVENTION

1. Field of the Invention

This invention relates to fast analog BiCMOS multiplexers (MUX) with CMOS control signals and particularly to the elimination of cross-signal feed-through in these high speed circuits.

2. Brief Description of the Known Art

FIG. 1 shows a fully differentially BiCMOS MUX which can be used to accommodate a wide varying common mode input signal for accomplishing fast analog multiplexing. In this circuit, two differential input signals INP1, INM1 and INP2, INM2 are converted to current by means of bipolar transistors 1–2 and resistors 5–6 or transistors 3–4 and resistors 7–8 depending on whether control signal SEL or SELB is selected and then this current is presented at resistors 9 or 10, respectively. Current always flows in current sources 11–14 and is routed by means of NMOS signal control switches 15–18 or is dumped to the supply via NMOS switches 19–22. The two output signals OUTP and OUTM are developed by coupling the signals from node $N_1$ (transistor 17—resistor 9 connection) and node $N_2$ (transistor 18—resistor 10 connection) to respective source followers comprised of bipolar transistors 23 and 24 and current sources 25 and 26, respectively. This circuit has good common mode characteristics, but is limited in performance by internal parasitic capacitances. It should also be noted that this circuit could be implemented using only CMOS circuitry, although the circuit would be slower and have higher distortion.

Analog multiplexers, used to select one of several input signals, often have undesirable signal feed-through where an attenuated level of an unselected signal appears as part of the output signal. This is due primarily to the parasitic capacitances associated with the CMOS transistors used to implement the control switches. As a result, this undesirable feed-through causes a degradation at the output of both signal-to-noise and dynamic range for the selected signal. Also, due to the parasitic capacitances at the nodes of the control switches, these circuits are often limited to the number of input signals which can be multiplexed.

Thus, there is a need for an improved high-speed MUX which eliminates the cross-signal feed-through problems of the prior art. The invention and embodiments disclosed herein address this need.

For further reference, U.S. Pat. No. 5,744,995 discusses multi-input multiplexer and U.S. Pat. No. 5,598,114 discusses high-speed multiplexers.

SUMMARY OF THE INVENTION

This invention addresses the shortcomings of conventional analog multiplexers to provide low distortion, high speed solutions with a high input-to-output signal multiplexing ratio. Two embodiments address the signal feed-through issue using BiCMOS circuitry; one with emphasis on improving a more conventional multiplexer circuit and the other using a new diode controlled approach. The first embodiment of this invention addresses the problem of parasitic capacitance in the reference circuit discussed in the prior art and significantly improves this circuit's performance by means of the CMOS control transistor layout to provide a faster multiplexer, although one which limits the number of input signals which can be multiplexed. A second embodiment uses an entirely new approach to develop a high-speed BiCMOS multiplexer with a large multiplexing ratio and low signal feed-through. In general, these designs take into account such parameters as input signal level, signal bandwidth, common mode operation, parasitic capacitance, and transistor layout. Both of these techniques can be applied to both single-ended and/or differential configurations.

DESCRIPTION OF THE PREFERRED EMBODIMENT

Figure 1:
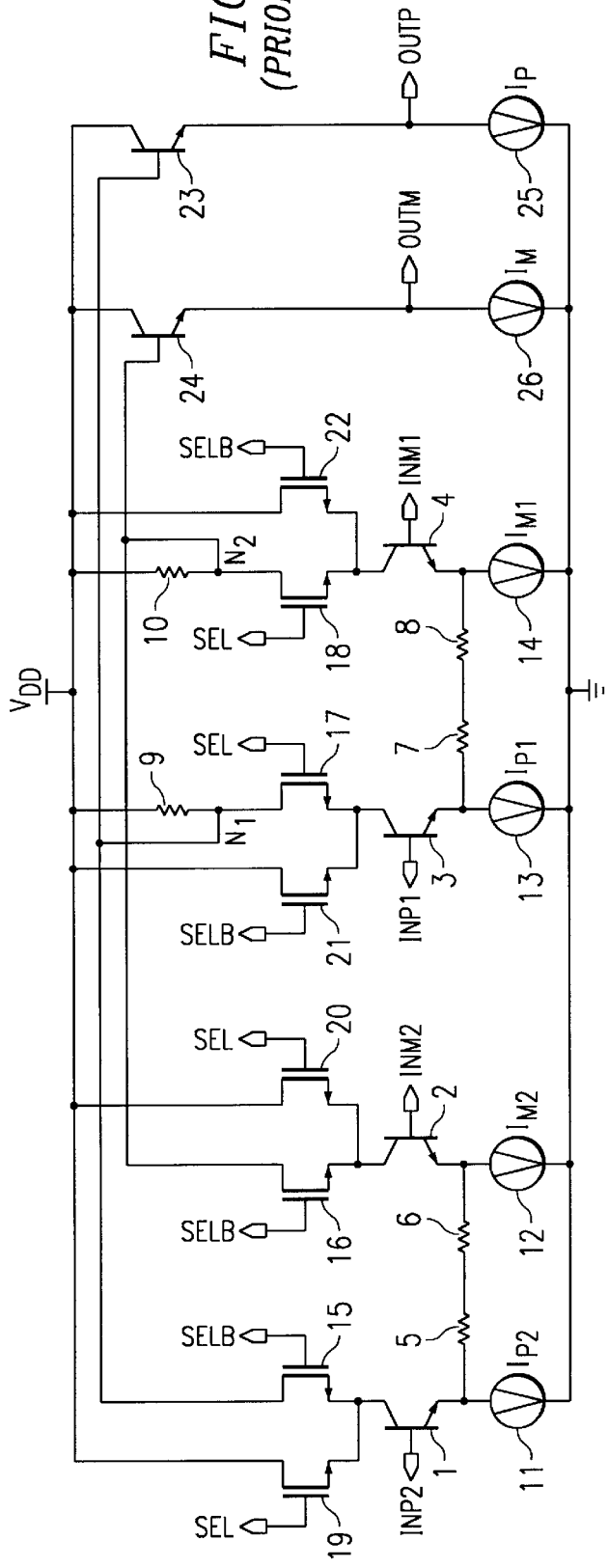
FIG. 1 shows a schematic for a differential BiCMOS MUX which has high bandwidth, low signal feed-through, and good common mode signal characteristics. (prior art)
Figure 2B:
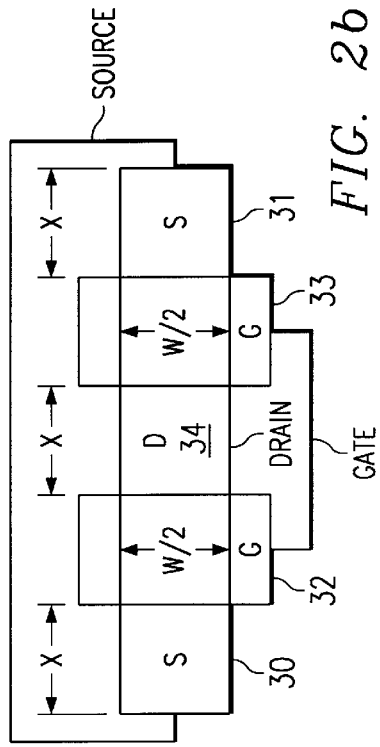
FIGS. 2a and 2b illustrate the layout of the CMOS control transistors of this invention with reduced parasitic output capacitance.
Figure 2A:
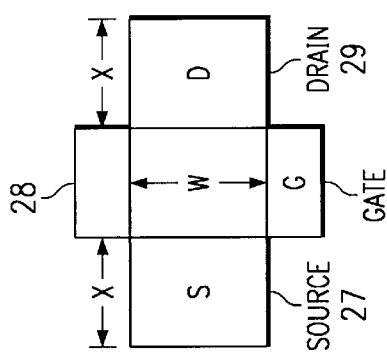

The differential BICMOS multiplexer circuit with CMOS control transistors, discussed in FIG. 1 of the prior art section above, has good common mode level characteristics, low signal feed-through, and a 2-to-1 MUX ratio. However, in a first embodiment of this invention, the speed of the multiplexer circuit is improved over conventional multiplexers, primarily through the layout of the N-MOS control switches 15–18, as illustrated in FIGS. 2a and 2b. These switches are made smaller and the layouts use an even number of "fingers" to reduce the parasitic capacitances at nodes $N_1$ and $N_2$. Although this will improve the speed of the multiplexer, it will limit the total number of input signals which can be multiplexed together, depending on the bandwidth requirements of the application. FIG. 2a shows a typical layout for a single finger N-MOS transistor which is comprised of a source 27, a gate 28, and a drain 29. In this case the source and drain capacitances are equal and given as the area of the gate width (w) and drain/source length (x), as follows:

$$C_S = C_D = x \cdot w.$$

On the other hand, for the lower capacitance layout of this invention, shown in FIG. 2b, the gate and source are split into two parts, or two "fingers", so that the transistor is comprised of sources 30 and 31, gates 32 and 33, and drain 34. In this case, the capacitance-to-area relationship becomes:

$$C_D = x \cdot w/2,$$

and $$C_S = 2 \cdot x \cdot w/2 = x \cdot w,$$

so that $$C_S = 2 \cdot C_D.$$

This means that a two "finger" device has a drain-to-bulk parasitic capacitance, $C_{dB}$, that is one-half the source capacitance, $C_S$, and as a result the total output capacitance is reduced by one-half. This layout can be used to obtain a significant boost of as much as 2× in the bandwidth of the MUX circuit, although the number of input signals which can be multiplexed is limited. There are many applications where a 2-to-1 or 3-to1 MUX is viable and this high speed circuit can be valuable.

Figure 3:
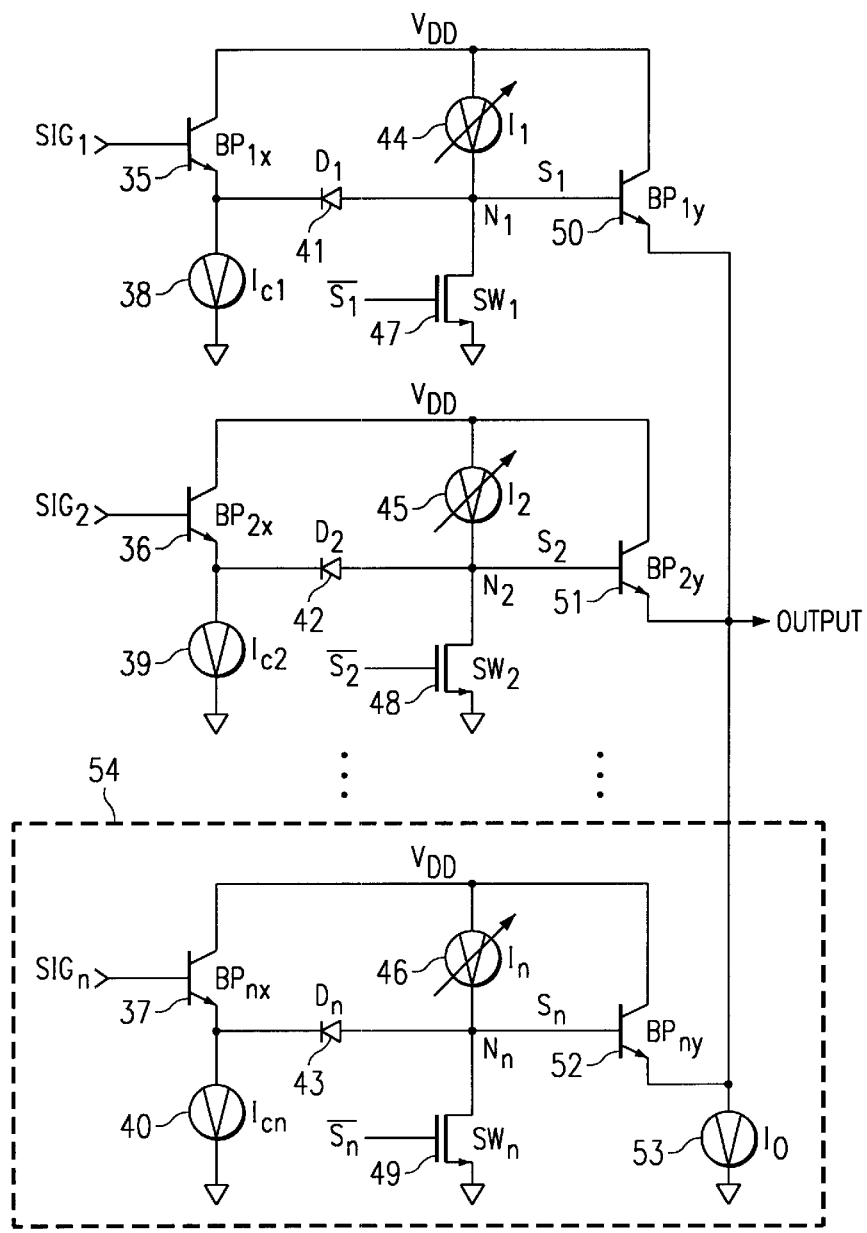
FIG. 3 shows a schematic for the new single-ended BiCMOS diode controlled MUX of this invention.

FIG. 3 shows yet another new embodiment for a fast analog BiCMOS MUX with CMOS control which has low signal feed-through and can be used to multiplex a large number of input signals. In this circuit, each signal leg is comprised of input emitter followers made up of bipolar transistors 35–37 and current sources 38–40, signal coupling diodes 41–43, switchable current sources 44–46, NMOS pull-down transistors 47–49, output emitter follower transistors 50–52, and an output current source 53.

$SW_1$, $SW_2$, ... $SW_n$ are small n-channel pull-down switches 47–49 used to turn off diodes $D_1$ 41, $D_2$ 42, ... $D_n$ 43. If Sig $_1$ is selected, current $I_1$ flowing in switchable current source $S_1$ 44 is turned on, while currents $I_2$, ... $I_n$ flowing in the switchable current sources $S_2$ 45 and $S_n$ 46 are turned off and pull-down switch $SW_1$ 47 is inhibited while pull-down switches $SW_2$ 48, ... $SW_n$ 49 are enabled. Diode $D_1$ 41 is turned on acting as a level shifter and bipolar transistor $BP_{1y}$ 50 along with the $I_o$ current source 53 form an emitter follower at the circuit's output, while diodes $D_2$ 42 and $D_n$ 43 and a bipolar transistors $BP_{2y}$ 51 and $BP_{ny}$ 45 are off.

On the other hand, when Sig $_1$ is not selected, current source $S_1$ 44 is turned off and $SW_1$ 47 is enabled causing diode $D_1$ 41 to turn off preventing any signal leakage to the output. In this state, since current source $S_1$ 44 is turned off, $SW_1$ 47 can be made small which reduces the parasitic capacitances at nodes $N_1$, $N_2$, ... $N_n$, hence improving the bandwidth of the circuit. This circuit has the advantage of being able to multiplex a large number of signals while maintaining low parasitic capacitance at the output and therefore excellent overall bandwidth. However, one drawback of the circuit is that the output signal's dc level will be one diode drop lower than that of the input signal since there are diode drops across the emitter-to-base of both transistors 35–37 and 50–52, but only one diode rise across diodes 41–43. One leg of the circuit is shown blocked 54 for further reference.

Figure 4:
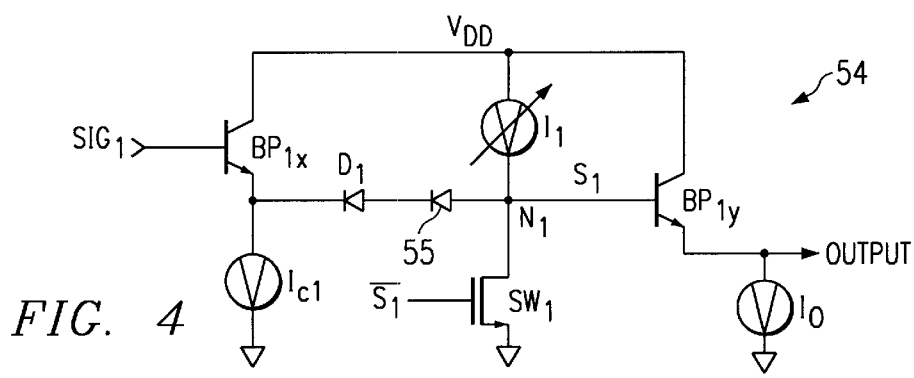
FIG. 4 shows a schematic for the new single-ended BiCMOS diode controlled MUX of this invention with signal level shifting for better common mode operation.

FIG. 4 shows another preferred adaptation of the MUX embodiment of FIG. 3 where each leg of the circuit 54 has a second diode 55 included to bring the dc level of the output signal back equal to that of the input signal. The addition of this second diode provides two diode rises to match the base-to-emitter diode drops across the two bipolar transistors. The advantage of such a scheme is that there is no loss in the common mode input vs. output signal. Depending on the application, this extra diode may or may not be required.

Figure 5:
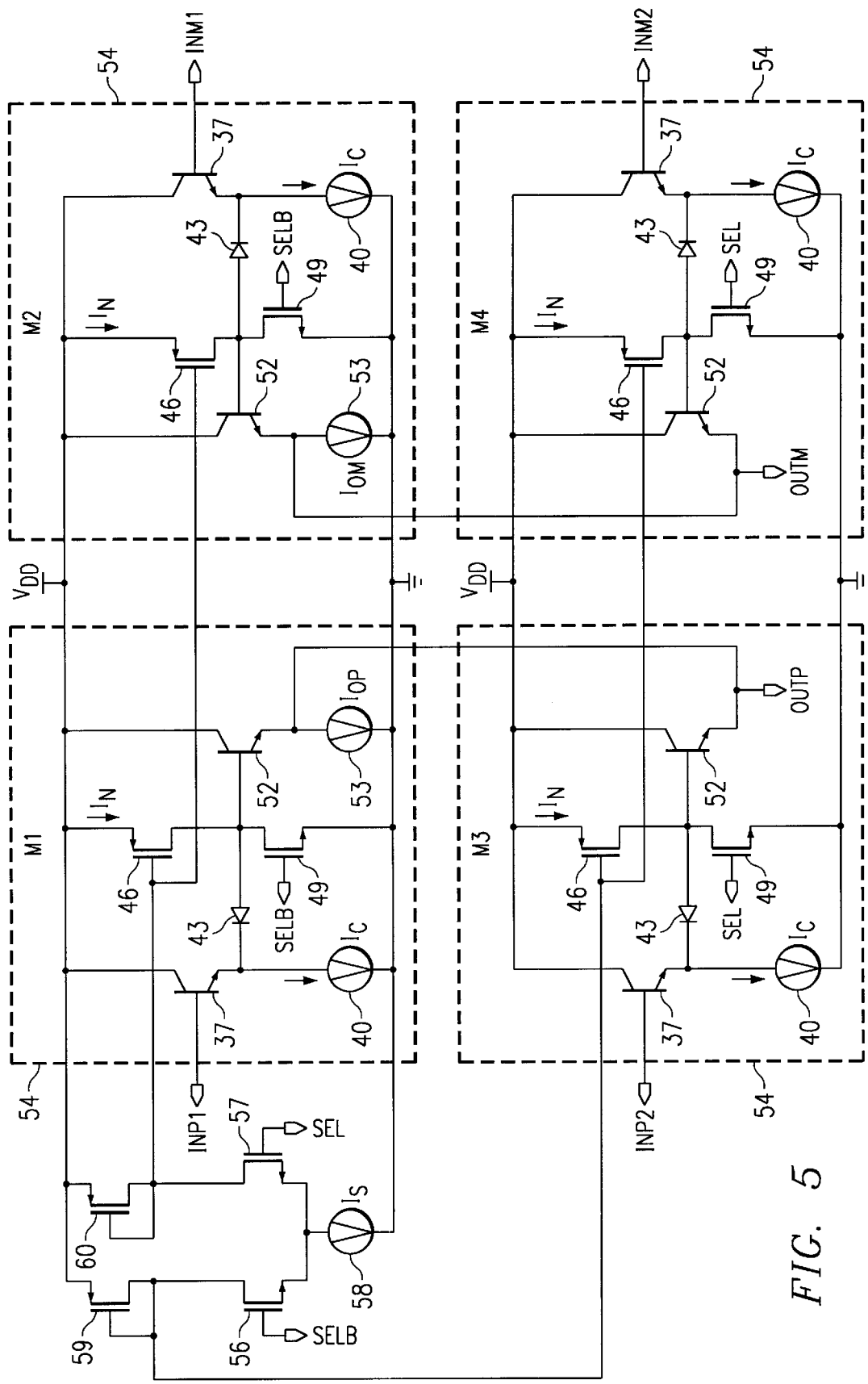
FIG. 5 shows a schematic for the new differential BiCMOS diode controlled MUX of this invention.

FIG. 5 shows a practical circuit embodiment of a fully differential 2-to-1 MUX for the approach given in FIG. 3 of this invention. Although shown for a 2-to-1 MUX, the circuit can be expanded to handle N-to-1 multiplexing applications, as well. This circuit is comprised of four of the basic BiCMOS MUX circuits 54 discussed in FIG. 3. The two differential inputs are INP1 & INM1 and INP2 & INM2. In this circuit, the two OUTP outputs are combined and coupled to a common output current source ($I_{OP}$) and likewise, the two OUTM outputs are combined and coupled to a common output current source ($I_{ON}$). The input control logic is comprised of two CMOS switches 56 and 57, two diode connected transistors 59 and 60, and a combined current source 58. Externally generated control signals SEL and SELB are used to enable the desired differential input signal INP1/INM1 or INP2/INM2 and inhibit the other input signal. This differential MUX has very low signal feed-through, low parasitic capacitance, high bandwidth, and with an expanded control logic can multiplex a large number of input signals.

While the invention has been described in the context of several preferred embodiments, it will appear to those skilled in the art that the present invention may be modified in numerous ways and may assume many embodiments other than that specifically set out and described above. Accordingly, it is intended by the appended claims to cover all modifications of the invention which fall within the true spirit and scope of the invention.

I claim:

1. A BiCMOS analog multiplexer circuit with CMOS control circuitry comprising:
   multiple pairs of bipolar transistors and resistors for converting multiple differential input signals to current;
   a pair of output resistors through which said current is presented to develop a differential output signal;
   a first plurality of NMOS control switch transistors for selecting desired input signal;
   a second plurality of NMOS control switch transistors for dumping unselected input signal currents to circuit ground;
   multiple current sources to maintain appropriate paths for current to continuously flow; and bipolar emitter follower pair at circuit output to provide output drive capability;
   wherein the circuit improvement comprises:
      said first plurality of NMOS control switch transistors having lower parasitic capacitance accomplished by said NMOS control switch transistors having their gates split into even number of fingers.

2. The BiCMOS analog multiplexer circuit of claim 1 wherein said MOS transistors having an even number of fingers, further comprise a CMOS transistor whose architecture has the source and gate split in half such that it consists of the sequence: one-half source, one-half gate, drain, one-half gate, and one-half source.

3. A BiCMOS analog multiplexer circuit comprising:
   a first differential input signal coupled to the bases of first and second bipolar transistors, respectively;
   a second differential input signal coupled to the bases of third and fourth bipolar transistors, respectively;
   the emitter of said first bipolar transistor coupled to the input of a first current source and to the first side of a first resistor;
   the emitter of said second bipolar transistor coupled to the input of a second current source and to the first side of a second resistor;
   the emitter of said third bipolar transistor coupled to the input of a third current source and to the first side of a third resistor;
   the emitter of said fourth bipolar transistor coupled to the input of a fourth current source and to the first side of a fourth resistor;
   the second side of said first and third resistors coupled to the second side of said second and fourth resistor, respectively;
   the collector of said first bipolar transistor coupled to the sources of a first and a second n-channel MOS transistor;

the collector of said second bipolar transistor coupled to the sources of a third and a fourth n-channel MOS transistor;

the collector of said third bipolar transistor coupled to the sources of a fifth and a sixth n-channel MOS transistor;

the collector of said fourth bipolar transistor coupled to the sources of a seventh and a eighth n-channel MOS transistor;

the drain of said first n-channel MOS transistor coupled to the drain of said fifth n-channel MOS transistor, to the base of a fifth bipolar transistor, and to the first side of a fifth resistor;

the drain of said third n-channel MOS transistor coupled to the drain of said seventh n-channel MOS transistor, to the base of a sixth bipolar transistor, and to the first side of a sixth resistor;

the drain of said second n-channel MOS transistor coupled to drains of said fourth, sixth, and eighth n-channel MOS transistors, to collector of said fifth and sixth bipolar transistors, to second side of said fifth and sixth resistors, and to a power source;

the emitter of said fifth bipolar transistor coupled to the input of a fifth current source and to the first differential output;

the emitter of said sixth bipolar transistor coupled to the input of a sixth current source and to the second differential output;

the outputs of said first, second, third, fourth, fifth, and sixth current sources coupled to circuit ground; and wherein the first, third, fifth and seventh n-channel MOS transistors have their gates split into an even number of fingers.

4. The BiCMOS analog multiplexer circuit of claim 3 wherein said MOS transistors having an even number of fingers, further comprise a CMOS transistor whose architecture has the source and gate split in half such that it consists of the sequence: one-half source, one-half gate, drain, one-half gate, and one-half source.

5. The BiCMOS analog multiplex circuit of claim 3 wherein said circuit is implemented fully in CMOS technology by replacing said bipolar transistors with MOS transistors.

6. A BiCMOS analog multiplexer circuit with CMOS control circuitry for single-ended input signals comprising:

a plurality of sub-circuits, each sub-circuit of said plurality of sub-circuits comprising: an input signal and an output signal;

an input emitter follower consisting of a bipolar transistor and a first fixed current source;

a switchable current source;

a NMOS pull-down transistor connected to the output of the switchable current source and ground;

a signal coupling diode connected between the emmitter of the bipolar transistor and the output of the switchable current source and coupled to said output signal;

wherein said multiplexer circuit further comprises;

a second fixed current source common to all said sub-circuits with signal outputs to provide a multiplexed output signal.

7. A BiCMOS analog multiplexer circuit comprising:

the base of a first bipolar input transistor coupled to the first input signal;

the base of a second bipolar input transistor coupled to the second input signal;

the base of a nth bipolar input transistor coupled to the nth input signal;

the emitter of said first bipolar input transistor coupled to the cathode of a first diode and to the input of a first current source;

the emitter of said second bipolar input transistor coupled to the cathode of a second diode and to the input of a second current source;

the emitter of said nth bipolar input transistor coupled to the cathode of a nth diode and to the input of a nth current source;

the outputs of said first, second, and nth current sources coupled to circuit ground;

the anode of said first diode coupled to the output of a first switchable current source, to the drain of a first n-channel MOS transistor, and to the base of a first bipolar output transistor;

the anode of said second diode coupled to the output of a second switchable current source, to the drain of a second n-channel MOS transistor, and to the base of a second bipolar output transistor;

the anode of said nth diode coupled to the output of a nth switchable current source, to the drain of a nth n-channel MOS transistor, and to the base of a nth bipolar output transistor;

the sources of said first, second, and nth n-channel MOS transistors connected to circuit ground;

the inputs of said first, second, and nth switchable current sources connected to the collectors of said first, second, and nth bipolar input transistors, to the collectors of said first, second, and nth bipolar output transistors, and coupled to a power supply;

the emitters of said first, second, and nth bipolar output transistors coupled together and to the input of an output current source and to the multiplexer output;

the output of said output current source coupled to circuit ground.

8. The BiCMOS analog multiplexer circuit of claim 7 further comprising a second coupling diode added in series with said coupling diode to provide good common-mode performance wherein the dc voltage level of the input and output signals are the same.

9. The BiCMOS analog multiplexer circuit of claim 8 further comprising:

the base of a first bipolar input transistor coupled to the input signal;

the emitter of said first bipolar input transistor coupled to the cathode of a first diode and to the input of a first current source;

the output of said first current source coupled to circuit ground;

the anode of said first diode coupled to the cathode of a second diode;

the anode of said second diode coupled to the output of a first switchable current source, to the drain of a first n-channel MOS transistor, and to the base of a second bipolar transistor;

the source of said first n-channel MOS transistor coupled to circuit ground;

the input of said first switchable current source connected to the collectors of said first and second bipolar transistors and coupled to a power supply;

the emitter of said second bipolar transistor coupled to the input of an output current source and to the multiplexer output;

the output of said output current source coupled to circuit ground.

10. The BiCMOS analog multiplexer circuit of claim 9 wherein said circuit is implemented fully in CMOS technology by replacing said bipolar transistors with MOS transistors.

11. A BiCMOS analog multiplexer circuit with CMOS control circuitry for differential input signals comprising at least two pairs of diode-coupled multiplexer sub-circuits wherein said sub-circuits further comprise:

an input emitter follower consisting of a first bipolar transistor and a first fixed current source;

a switchable current source;

a NMOS pull-down transistor;

an output emitter follower consisting of a second bipolar transistor and a second fixed current source; and a signal coupling diode with a cathode connected to the emitter of the first bipolar transistor and an anode connected to a base of the second bipolar transistor.

12. The BiCMOS analog multiplexer circuit of claim 11 further comprising:

two or more pairs of said diode coupled multiplexer sub-circuits having power inputs connected together and coupled to a power supply;

two or more multiple pairs of the diode coupled multiplexer circuits having ground inputs connected together and coupled to circuit ground;

the first positive differential input signal coupled to the input of a first multiplexer circuit;

the first negative differential input signal coupled to the input of a second multiplexer circuit;

the second positive differential input signal coupled to the input of a third multiplexer circuit;

the second negative differential input signal, coupled to the input of a fourth multiplexer circuit;

the source of a first n-channel MOS transistor coupled to the source of a second n-channel MOS transistor and to the input of a current source;

the drain of said first n-channel MOS transistor coupled to the gate and the drain of a first p-channel MOS transistor and to the first control input of said first multiplexer and said second multiplexer;

the drain of said second n-channel MOS transistor coupled to the gate and the drain of a second p-channel MOS transistor and to the first control input of said third multiplexer and said fourth multiplexer;the sources of said first and said second p-channel MOS transistors coupled to power input of said first, second, third, and fourth multiplexer circuits and to a power supply;

the output of said current source coupled to ground connection of said first, second, third, and fourth multiplexer circuits and to circuit ground;

the second control input of said first multiplexer and said second multiplexer coupled to negative control input signal;

the second control input of said third multiplexer and said fourth multiplexer coupled to positive control input signal;

the output of said first multiplexer coupled to the output of said third multiplexer and to the positive differential circuit output;

the output of said second multiplexer coupled to output of said fourth multiplexer and to negative differential circuit output; wherein at least one of said MOS transistors have an even number of fingers.

13. The BiCMOS multiplexer circuit of claim 12 further further comprising a second coupling diode added in series with said coupling diode to provide good common-mode performance wherein the dc voltage level of the input and output signals are the same.

14. The BiCMOS analog multiplexer circuit of claim 13 wherein said circuit is implemented fully in CMOS technology by replacing said bipolar transistors with MOS transistors.

15. The BiCMOS analog multiplexer circuit of claim 13 wherein said MOS transistors having an even number of fingers, further comprise a CMOS transistor whose architecture has the source and gate split in half such that it consists of the sequence: one-half source, one-half gate, drain, one-half gate, and one-half source.

* * * * *